United States Patent
Kim et al.

(10) Patent No.: US 12,040,337 B2
(45) Date of Patent: Jul. 16, 2024

(54) SEMICONDUCTOR PACKAGE WITH PROTECTIVE MOLD

(71) Applicant: SAMSUNG ELECTRONICS CO., LTD., Suwon-si (KR)

(72) Inventors: Sun Jae Kim, Seoul (KR); Sun Kyoung Seo, Cheonan-si (KR); Yong Hoe Cho, Cheonan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 375 days.

(21) Appl. No.: 17/231,814

(22) Filed: Apr. 15, 2021

(65) Prior Publication Data

US 2022/0077209 A1 Mar. 10, 2022

(30) Foreign Application Priority Data

Sep. 4, 2020 (KR) ........................ 10-2020-0112714

(51) Int. Cl.
*H01L 27/146* (2006.01)

(52) U.S. Cl.
CPC .. *H01L 27/14618* (2013.01); *H01L 27/14636* (2013.01)

(58) Field of Classification Search
CPC ......... H01L 27/14618; H01L 27/14636; H01L 27/14621; H01L 27/14627; H01L 23/5383; H01L 23/13; H01L 23/31; H01L 23/481; H01L 23/485; H01L 23/49827; H01L 23/525; H01L 23/5384; H01L 27/14665; H01L 25/0657
See application file for complete search history.

(56) References Cited

U.S. PATENT DOCUMENTS

| | | |
|---|---|---|
| 6,472,247 B1 | 10/2002 | Andoh et al. |
| 7,569,408 B1 | 8/2009 | Un et al. |
| 7,728,438 B2 | 6/2010 | Kameyama et al. |
| 8,164,191 B2 | 4/2012 | Nakamura |
| 9,960,197 B1 | 5/2018 | Wu |
| 10,249,672 B2 | 4/2019 | Fujimori et al. |
| 10,608,028 B2 | 3/2020 | Yamamoto et al. |
| 2009/0059055 A1 | 3/2009 | Nakano et al. |
| 2009/0256260 A1* | 10/2009 | Nakamura ........ H01L 27/14683 257/431 |

(Continued)

*Primary Examiner* — Jonathan Han
(74) *Attorney, Agent, or Firm* — F. CHAU & ASSOCIATES, LLC

(57) ABSTRACT

Provided is a semiconductor package. The semiconductor package includes an image sensor chip including a first surface and a second surface opposite to each other in a first direction; a transparent substrate spaced apart from the second surface of the image sensor chip in a second direction, wherein the transparent substrate includes a first part and a second part with a width different from the first part; an adhesive layer disposed between the second surface of the image sensor chip and the first part of the transparent substrate; and a mold layer on the second part of the transparent substrate, wherein the mold layer comprises side surfaces that extend along the first part of the transparent substrate, and further extend along side surfaces of the adhesive layer and side surfaces of the image sensor chip, and not extending along the first surface of the image sensor chip.

20 Claims, 11 Drawing Sheets

(56) References Cited

U.S. PATENT DOCUMENTS

| | | | |
|---|---|---|---|
| 2016/0133762 A1* | 5/2016 | Blasco Claret | H04N 25/134 |
| | | | 438/69 |
| 2018/0138225 A1* | 5/2018 | Kim | H04N 25/75 |
| 2019/0172861 A1* | 6/2019 | Hsieh | H01L 23/60 |
| 2019/0172864 A1* | 6/2019 | Hsu | H01L 24/92 |
| 2019/0214423 A1* | 7/2019 | Kim | H01L 24/05 |

* cited by examiner

SEMICONDUCTOR PACKAGE WITH PROTECTIVE MOLD

CROSS-REFERENCE TO RELATED APPLICATION

This application claims priority under 35 U.S.C. § 119 to Korean Patent Application No. 10-2020-0112714, filed on Sep. 4, 2020, the disclosure of which is incorporated herein by reference in its entirety.

TECHNICAL FIELD

The present disclosure relates to a semiconductor package. More particularly, the present disclosure relates to a semiconductor package having a protective mold.

DISCUSSION OF THE RELATED ART

Image sensors are used in electronic devices to convert optical information into electrical signals. Common image sensors include charge coupled device (CCD) image sensors and complementary metal-oxide semiconductor (CMOS) image sensors.

The image sensor may be configured in the form of a package. The package may be configured as a structure such that the image sensor is protected and light may be incident on a photo receiving surface or a sensing region of the image sensor.

SUMMARY

Aspects of the present disclosure provide a semiconductor package having increased product reliability.

Aspects of the present disclosure also provide a method for fabricating a semiconductor package capable of fabricating a semiconductor package with increased product reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a semiconductor package is provided that includes an image sensor chip including a first surface and a second surface opposite to each other in a first direction; a transparent substrate spaced apart from the second surface of the image sensor chip in a second direction, wherein the transparent substrate includes a first part having a first width in the second direction, and a second part on the first part having a second width greater than the first width in the second direction; an adhesive layer disposed between the second surface of the image sensor chip and the first part of the transparent substrate; and a mold layer on the second part of the transparent substrate, wherein the mold layer includes side surfaces that extend along the first part of the transparent substrate, and further extend along side surfaces of the adhesive layer and side surfaces of the image sensor chip, and does not extend along the first surface of the image sensor chip.

According to some embodiments of the present disclosure, a semiconductor package is provided which includes an image sensor chip which includes a redistribution layer, a first substrate layer disposed on the redistribution layer and including a penetration electrode, and a second substrate layer disposed on the first substrate layer and including a photoelectric conversion element electrically connected to the redistribution layer by the penetration electrode penetrating the first substrate layer; a transparent substrate proximate to the image sensor chip in the first direction, wherein the transparent substrate includes a first part having a first width in a second direction, and a second part having a second width greater than the first width in the second direction on the first part; adhesive layers disposed between the image sensor chip and the transparent substrate to space apart the image sensor chip and the transparent substrate in the second direction; and a mold layer on the second part of the transparent substrate, wherein the mold layer covers side surfaces of the first part of the transparent substrate, side surfaces of the adhesive layer and side surfaces of the image sensor chip, in which the side surfaces of the image sensor chip have a straight shape, and a thickness of the first part of the transparent substrate in the first direction is greater than a thickness of the second part on the first part of the transparent substrate in the first direction.

According to some embodiments of the present disclosure, a semiconductor package is provided which includes an image sensor chip including a first surface on which a connection pad is formed and a second surface opposite to the first surface in a first direction and on which a photoelectric conversion element is formed; a transparent substrate opposite to the second surface of the image sensor chip in the first direction, wherein the transparent substrate includes a first part having a first width in a second direction, and a second pan on the first part having a second width greater than the first width in the second direction; adhesive layers which are disposed between the second surface of the image sensor chip and the first part of the transparent substrate to space apart the image sensor chip and the first part of the transparent substrate in the second direction, and wherein the adhesive layers adhere the image sensor chip and the transparent substrate to each other; a mold layer on the second part of the transparent substrate, wherein the mold layer extends along side surfaces of the first part of the transparent substrate, side surfaces of the adhesive layer and side surfaces of the image sensor chip, and does not extend along a lower surface of the image sensor chip; and a connection terminal disposed on the connection pad, in which the image sensor chip includes a passivation layer which wraps the side surfaces of the connection pad and constitutes the first surface of the image sensor chip, a redistribution layer electrically connected to the connection pad on the passivation layer, a first substrate layer disposed on the redistribution layer and including a penetration electrode, and a second substrate layer including the photoelectric conversion element, and wherein the penetration electrode penetrates the first substrate layer and electrically connects the redistribution layer and the photoelectric conversion element, and a thickness of the first part of the transparent substrate in the first direction is greater than a thickness of the second part on the first part of the transparent substrate in the first direction.

According to some embodiments of the present disclosure, a method for fabricating a semiconductor package is provided, the method including: partially etching a glass wafer along a boundary of a glass unit wafer to form a first part having a first width and a second part having a second width smaller than the first width above the first part; mounting an image sensor chip on the second part of the glass wafer; attaching a substrate onto the image sensor chip; forming a mold layer which fills a space between the glass wafer and the substrate between the glass wafer and the substrate, wherein the mold layer has an upper surface forming the same plane as an upper surface of the image sensor chip; removing the substrate from the image sensor chip; forming a connection terminal on the image sensor chip from which the substrate is removed; and completely cutting the glass wafer along the boundary of the unit glass wafer.

Various objects and embodiments of the present inventive concepts are not limited to the mentioned above, and other objects and embodiments which have not been mentioned above will be clearly understood to those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
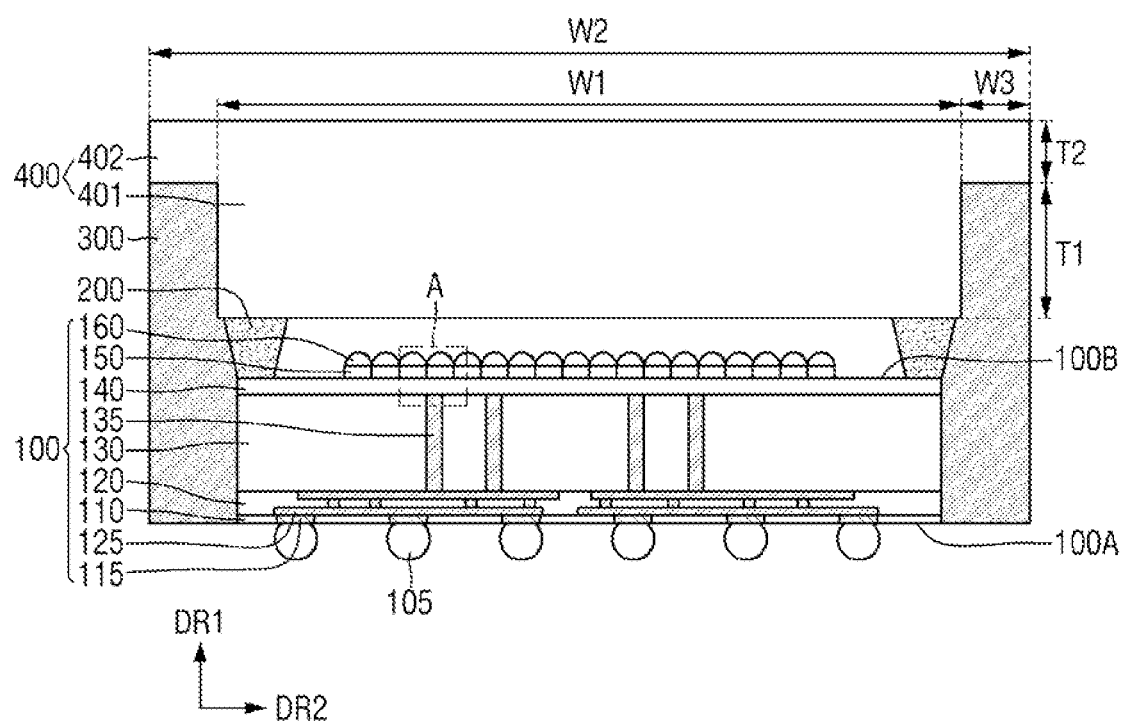
FIG. 1 is a diagram illustrating a semiconductor package according to an embodiment.

Hereinafter, various example embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

Further, when an element is stated to be "on" another element, the elements may be in direct contact with each other, or there may be interposing layers therebetween. Additionally, whenever a layer is said to "wrap" another element, the layer may substantially surround all sides of the element, and may or might not expose a portion of the element to the outside of the layer.

Figure 2:
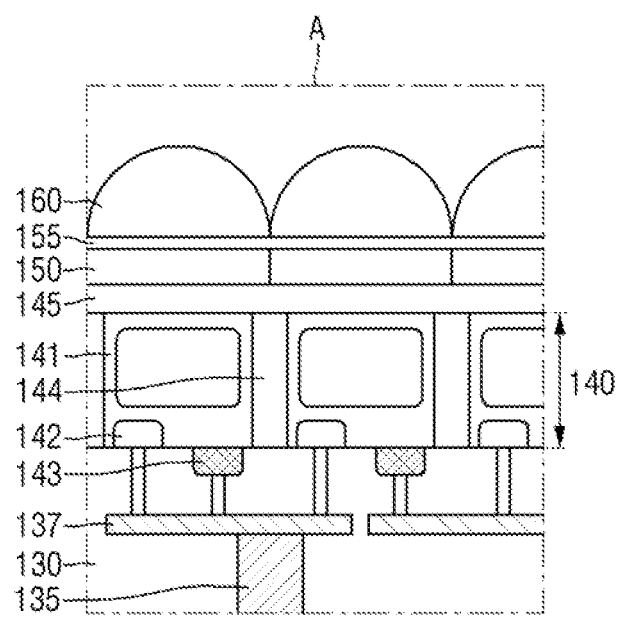
FIG. 2 is an enlarged view of a region A of FIG. 1.

FIG. 1 is a diagram illustrating a semiconductor package according to some embodiments. FIG. 2 is an enlarged view of a region A of FIG. 1.

Referring to FIGS. 1 and 2, the semiconductor package according to some embodiments may include an image sensor chip 100, a connection terminal 105, an adhesive layer 200, a mold layer 300, and a transparent substrate 400.

The image sensor chip 100 may include a first surface 100A and a second surface 100B opposite to the first surface. The first surface 100A and the second surface 100B may be, for example, opposite to each other in a first direction DR1. In the first direction DR1, the first surface 100A may be a lower surface of the image sensor chip 100, and the second surface 100B may be an upper surface of the image sensor chip 100.

In some embodiments, side surfaces of the image sensor chip 100 may be straight.

The connection terminal 105 may be disposed on the first surface 100A of the image sensor chip 100. The connection terminal 105 may protrude from the first surface 100A of the image sensor chip 100. The connection terminal 105 might not be disposed in a passivation layer 110 to be described later.

The connection terminal 105 may include solder material. For example, the first solder ball 185 may include, but is not necessarily limited to, at least one of lead (Pb), tin (Sn), indium (In), bismuth (Bi), antimony (Sb), silver (Ag), and alloys thereof.

The image sensor chip 100 may include a passivation layer 110, a redistribution insulation layer 120, a first substrate layer 130, a second substrate layer 140, a color filter 150, and a microlens 160.

The passivation layer 110 may form the first surface 100A of the image sensor chip 100. The passivation layer 110 may include a connection pad 115 having a lower surface exposed from the first surface 100A of the image sensor chip 100. The passivation layer 110 may surround lateral sides of the connection pad 115. A connection terminal 105 may be disposed on the connection pad 115.

The redistribution insulation layer 120 may be disposed on the passivation layer 110. The redistribution layer 125 may be formed in the redistribution insulation layer 120. The redistribution insulation layer 120 may wrap the redistribution layer 125. The redistribution layers 125 may be stacked sequentially in the first direction DR1. The redistribution layer 125 may be electrically connected to the connection pad 115.

The passivation layer 110 and the redistribution insulation layer 120 may be made of, for example, a passivation substance such as polyimide. In another embodiment, the passivation layer 110 and the redistribution insulation layer 120 may include BCB (benzocyclobutenes), polybenzeneoxazole, polyimide, epoxy, silicon oxide, silicon nitride or combinations thereof, though the materials of the passivation layer 110 and the redistribution insulation layer 120 are not necessarily limited thereto.

The redistribution layer 125 may include a conductive substance. The redistribution layer 125 may include, for example, but is not limited to, at least one of copper (Cu), aluminum (Al), silver (Ag), tin (Sn), gold (Au), nickel (Ni), lead (Pb), titanium (Ti), and alloys thereof.

The first substrate layer 130 may be disposed on the redistribution insulation layer 120. A pixel gate layer 143 may be disposed in the first substrate layer 130. The first substrate layer 130 may include, for example, at least one of silicon oxide, silicon nitride, silicon oxynitride and a low-k substance having a lower dielectric constant than silicon oxide. The low-k substance may include, for example, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

A connection wiring 137 may be disposed in the first substrate layer 130. The connection wiring 137 may be electrically connected to a storage node region 142, a photoelectric conversion element 141, and a pixel gate layer 143.

The connection wiring 137 may include a wiring barrier layer and a wiring filling layer. The wiring barrier layer may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). The wiring filling layer may include, for example, at least one of aluminum (Al), copper (Cu), tungsten (W), cobalt (Co), ruthenium (Ru) and molybdenum (Mo).

A penetration electrode 135 may be formed in the first substrate layer 130. The penetration electrode 135 may penetrate the first substrate layer 130 and electrically connect the redistribution layer 125 and the connection wiring 137. The redistribution layer 125 and the photoelectric conversion element 141 may be electrically connected accordingly.

The second substrate layer 140 may be disposed on the first substrate layer 130. The second substrate layer 140 may be, for example, bulk silicon or SOI (silicon-on-insulator). In contrast, the second substrate layer 140 may be a silicon substrate or may include, but is not limited to, other substances such as silicon germanium, SGOI (silicon germanium on insulator), indium antimonide, lead tellurium compounds, indium arsenic, indium phosphorus, gallium arsenide or gallium antimonide.

The storage node region 142 may be formed in the second substrate layer 140. The storage node region 142 may be spaced apart from the photoelectric conversion element 141. The storage node region 142 may include impurities of a conductive type different from that of the second substrate layer 140. The storage node region 142 may be a region corresponding to the floating diffusion region FD.

The photoelectric conversion element 141 may be disposed in the second substrate layer 140. The photoelectric conversion element 141 may generate a light charge in proportion to an amount of light incident from the outside. The photoelectric conversion element 141 is configured to receive light and may convert an optical signal into an electric signal. The photoelectric conversion element 141 may be formed by doping impurities in the second substrate layer 140. For example, the photoelectric conversion element 141 may have a concentration difference of impurities between the upper part and the lower part of the photoelectric conversion element 141 to have a voltage potential gradient. For example, the photoelectric conversion element 141 may be formed with a plurality of stacked impurity regions.

The pixel separation region 144 may surround the photoelectric conversion element 141. Although the pixel separation region 144 is shown to extend from the lower surface to the upper surface of the second substrate layer 140, this is for convenience of explanation, and the embodiment is not necessarily limited thereto. The pixel separation region 144 may prevent the light charges generated in a specific pixel by the incident light from moving to the adjacent pixel region by a random drift. Further, the pixel separation region 144 may refract the incident light which is obliquely incident on the photoelectric conversion element 141.

A first flattening film 145 may be disposed on the second substrate layer 140. The first flattening film 145 may include an insulating substance, for example, a silicon oxide film. In some cases, the first flattening film 145 may be omitted.

A color filter 150 may be disposed on the first flattening film 145. The color filter 150 may be disposed over the photoelectric conversion element 141. The color filter 150 may allow light of a specific wavelength to pass through and reach the lower photoelectric conversion element 141. The color filter 150 may be implemented, for example, as a color filter array including at least one of a red (R) filter, a green (G) filter and a blue (B) filter. The color filter 150 may be formed from or include, for example, a substance obtained by mixing resin with a pigment including a metal or a metal oxide.

A second flattening film 155 may be disposed on the color filter 150. The second flattening film 155 may include an insulating substance, for example, a silicon oxide.

A microlens 160 may change a route of light incident on the regions other than the photoelectric conversion element 141 and may collect the light into the photoelectric conversion element 141. The microlens 160 may include, but is not limited to, organic substances such as light transmissive resin.

The adhesive layer 200 may be disposed between the second surface 100B of the image sensor chip 100 and the transparent substrate 400. The adhesive layers 200 may be spaced apart in a second direction DR2. The image sensor chip 100 may be spaced apart from the transparent substrate 400 in the first direction DR1 by the adhesive layer 200.

The adhesive layer 200 may define a cavity between the second surface 100B of the image sensor chip 100 and the first part 401 of the transparent substrate 400. The cavity may be filled with air. The microlens 160 may be disposed in the cavity.

In FIG. 1, although the side surfaces of the adhesive layer 200 are shown with a linear shape, the embodiment is not limited thereto. The adhesive layer 200 may have various forms of side surfaces.

The adhesive layer 200 may include, for example, a curable polymer. The adhesive layer 200 may include, for example, an epoxy-based polymer.

The transparent substrate 400 may be disposed on the second surface 100B of the image sensor chip 100. The transparent substrate 400 may be attached to the second surface 100B of the image sensor chip 100 by the adhesive layer 200. In some embodiments, the transparent substrate 400 may be a glass substrate. In another embodiment, the transparent substrate 400 may be a plastic substrate.

In some embodiments, a width of the transparent substrate 400 in the second direction D2 (e.g., a first width W1 or a second width W2 to be described below) may be greater than a width of the image sensor chip 100 in the second direction DR2.

The transparent substrate 400 may include a first part 401 having a first width W1 in the second direction DR2, and a second part 402 having a second width W2 in the second direction DR2. The second part 402 may be disposed on the first part 401. The second part 402 may be adhered to the image sensor chip 100 by the adhesive layer 200.

The second width W2 may be greater than the first width W1. One side wall of the second part 402 may protrude from one side wall of the first part 401. For example; the second part 402 may be a portion protruding from the first part 401.

In some embodiments, a difference between the second width W2 and the first width W1 may be about 500 μm or less. For example, a distance W3 from one side wall of the first part 401 to one side wall of the second part 402 may be about 250 μm or less.

In some embodiments, a thickness T1 of the first part 401 of the transparent substrate 400 in the first direction DR1 may differ from a thickness T2 of the second part 402 of the transparent substrate 400. The thickness T1 of the first part 401 of the transparent substrate 400 in the first direction DR1 may be greater than the thickness T2 of the second part 402 of the transparent substrate 400. For example, the thickness T1 of the first part 401 of the transparent substrate 400 in the first direction DR1 may be more than twice the thickness T2 of the second part 402 of the transparent substrate 400.

The mold layer 300 may be disposed on the second part 402 of the transparent substrate 400. The mold layer 300 may cover side surfaces of the image sensor chip 100, side surfaces of the adhesive layer 200, and side surfaces of the first part 401 of the transparent substrate 400. The mold layer 300 may extend along the side surfaces of the image sensor chip 100, the side surfaces of the adhesive layer 200, and the side surfaces of the first part 401 of the transparent substrate 400.

The mold layer 300 might not extend along the first surface 100A of the image sensor chip 100. For example, the lower surface of the mold layer 300 may be disposed on the same plane as the first surface 100A of the image sensor chip 100.

The side surfaces of the mold layer 300 may be disposed on the same plane as the side surface of the second part 402 of the transparent substrate 400. The side surfaces of the mold layer 300 may be continuous with the side surfaces of the second part 402 of the transparent substrate 400. This may be attributed to the process of forming the mold layer 300. For example, the mold layer 300 and the second part 402 of the transparent substrate 400 may be cut at the same time by a singulation process of dividing a plurality of semiconductor packages into individual semiconductor packages. The side surfaces of the mold layer 300 and the side surfaces of the second part 402 of the transparent substrate 400 may be continuously formed accordingly.

Further, since the width of the image sensor chip 100 in the second direction DR2 is smaller than the widths W1 and W2 of the transparent substrate 400 in the second direction DR2, the image sensor chip 100 might not overlap the mold layer 300 in the first direction DR1.

The mold layer 300 may include an insulating substance. For example, the mold layer 300 may include a thermosetting resin such as an epoxy resin, a thermoplastic resin such as polyimide, or resin in which these resins are mixed with an inorganic filler or impregnated into core materials such as glass fiber (glass cloth, glass fabric) together with inorganic filler (e.g., prepreg, ABF (Ajinomoto Build-up Film), FR-4, and BT (Bismaleimide Triazine)) and the like. Or, the mold layer 300 may include a photoimageable dielectric (PID).

Since the transparent substrate 400 of the semiconductor package according to some embodiments includes the first part 401 disposed below the second part 402, the mold layer 300 may wrap not only the side surfaces of the image sensor chip 100 and the side surfaces of the adhesive layer 200, but also at least a part of the side surfaces of the transparent substrate 400, for example, the side surfaces of the first part 401. An area in which the mold layer 300 is in contact with the transparent substrate 400 may be further increased accordingly. Therefore, the strength of the semiconductor package may be increased.

In addition to the adhesive layer 200, since the mold layer 300 wraps the side surfaces of the transparent substrate 400 and the image sensor chip 100, the adhesive strength of the transparent substrate 400 and the image sensor chip 100 may be increased. Accordingly, the product reliability of the semiconductor package may be increased.

Further, the photoelectric conversion element 141 of the semiconductor package according to some embodiments may be electrically connected to the connection terminal 105 by the internal wirings of the image sensor chip 100 such as the penetration electrode 135 and the redistribution layer 125. For example, the internal wirings are not exposed to the outside. Therefore, the wirings are protected, and the reliability of the semiconductor package product may be increased.

Figure 3:
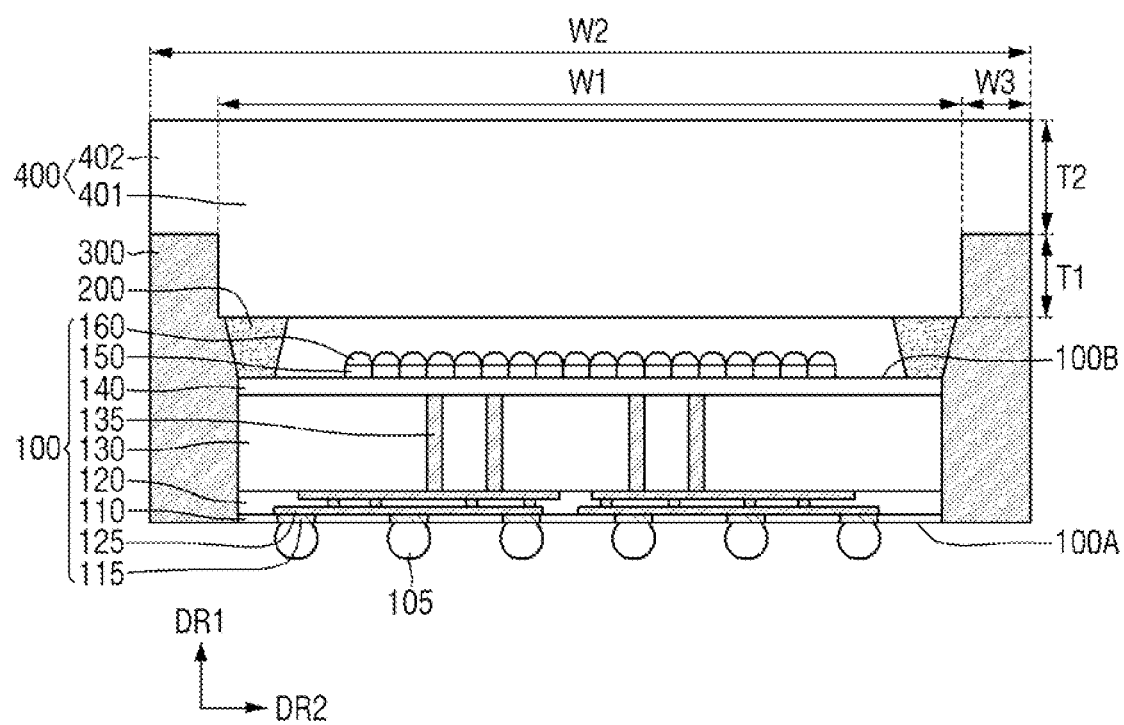
FIG. 3 is a diagram illustrating a semiconductor package according to another embodiment.

FIG. 3 is a diagram illustrating a semiconductor package according to another embodiment. For convenience of explanation, description different from contents explained using FIGS. 1 and 2 will be mainly explained.

Referring to FIG. 3, in the semiconductor package according to another embodiment, a thickness T1 of the first part 401 of the transparent substrate 400 in the first direction DR1 may be smaller than a thickness T2 of the second part 402 of the transparent substrate 400. The thickness T2 of the second part 402 of the transparent substrate 400 may be more than twice the thickness T1 of the first part 401 of the transparent substrate 400 in the first direction DR1.

Figure 4:
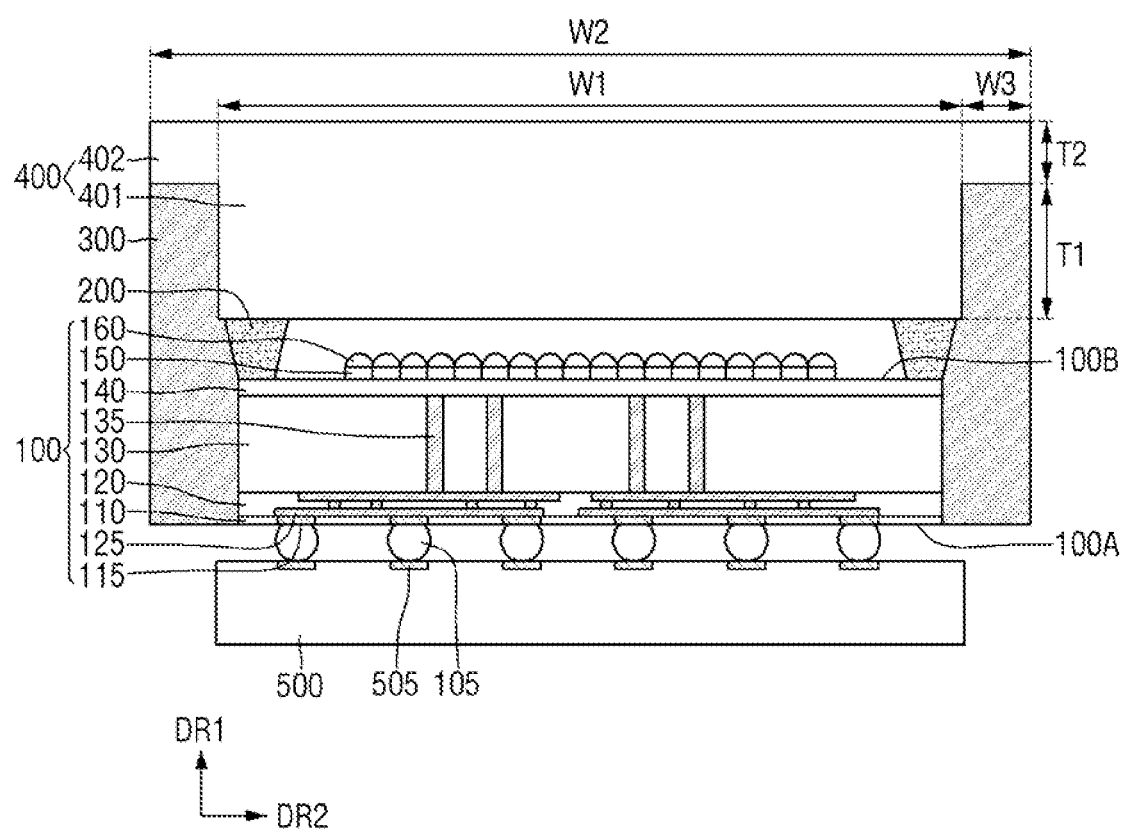
FIG. 4 is a diagram illustrating a semiconductor package according to another embodiment.

FIG. 4 is a diagram illustrating a semiconductor package according to another embodiment. For convenience of explanation, description different from contents explained using FIGS. 1 and 2 will be mainly explained.

Referring to FIG. 4, the semiconductor package according to some other embodiment may further include a semiconductor chip 500.

A semiconductor chip 500 may be disposed on the first surface 100A of the image sensor chip 100. The connection terminal 105 may be disposed on a chip pad 505 of the semiconductor chip 500. The semiconductor chip 500 may be electrically connected to the image sensor chip 100 through the connection terminal 105.

In an example embodiment, the semiconductor chip 500 may include, a memory element, a digital signal process integrated circuit, an application specific integrated circuit, and a driver.

Figure 5:
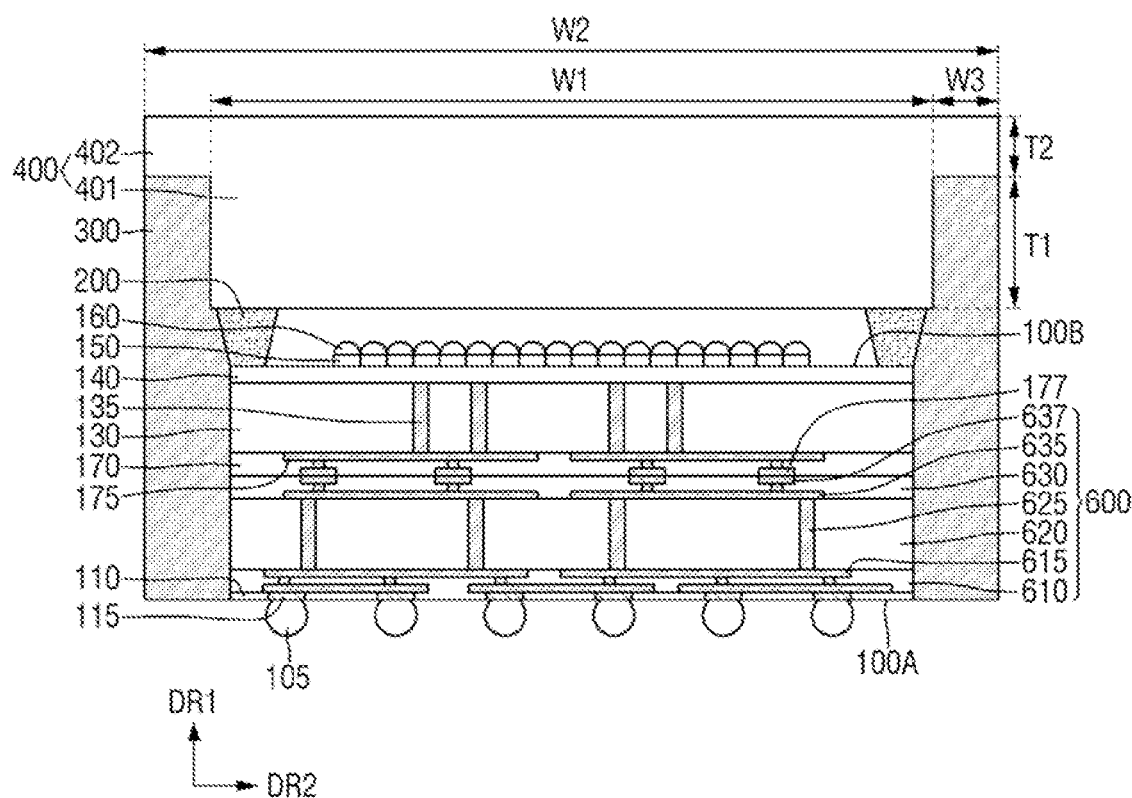
FIG. 5 is a diagram illustrating a semiconductor package according to another embodiment.

FIG. 5 is a diagram illustrating a semiconductor package according to another embodiment. For convenience of explanation, description different from contents explained using FIGS. 1 and 2 will be mainly explained.

Referring to FIG. 5, the semiconductor package according to another embodiment may further include a first semiconductor chip 600.

The first semiconductor chip 600 may be a logic chip that converts the light detected from the image sensor chip 100 into an electric signal.

The first semiconductor chip 600 may be disposed on the passivation layer 110. The first semiconductor chip 600 may include a second insulation layer 610, a semiconductor substrate layer 620, and a second wiring insulation layer 630.

The second insulation layer 610 may be disposed on the first passivation layer 110. The second redistribution layer 615 may be formed in the second insulation layer 610. The second insulation layer 610 may wrap the second redistribution layer 615. The second redistribution layers 615 may be stacked sequentially in the first direction DR1. The second redistribution layer 615 may be electrically connected to the connection pad 115.

The semiconductor substrate layer 620 may be disposed on the second insulation layer 610. The semiconductor substrate layer 620 may be, for example, bulk silicon or SOI (silicon-on-insulator). In contrast, the second substrate layer 140 may be a silicon substrate or may include other substances such as silicon germanium, SGOI (silicon germanium on insulator), indium antimonide, lead tellurium compounds, indium arsenic, indium phosphorus, gallium arsenide or gallium antimonide.

A second penetration electrode 625 may be formed in the semiconductor substrate layer 620. The second penetration electrode 625 may penetrate the semiconductor substrate layer 620 and electrically connect the second redistribution layer 615 and a second wiring layer 635 to be described later. The second semiconductor chip 60 and the photoelectric conversion element 141 may be electrically connected accordingly.

The second wiring insulation layer 630 may be disposed on the semiconductor substrate layer 620. The second wiring layer 635 may be formed in the second wiring insulation layer 630. The second wiring insulation layer 630 may wrap the second wiring layer 635. A second bonding pad 637 may be formed in the second wiring insulation layer 630. The second bonding pad 637 may be electrically connected to the second wiring layer 635.

The first wiring insulation layer 170 may be disposed between the second wiring insulation layer 630 and the first substrate layer 130. The first wiring layer 175 may be formed in the first wiring insulation layer 170. The first bonding pad 177 may be formed in the first wiring insulation layer 170. The first bonding pad 177 may be electrically connected to the first wiring layer 175.

The first bonding pad 177 may be directly connected to the second bonding pad 637. That is, the first bonding pad 177 may be directly bonded to the second bonding pad 637.

The first bonding pad 177 and the second bonding pad 637 may include a pad barrier layer and a pad filling layer, respectively. The pad barrier layer may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). The pad filling layer may include, for example, copper (Cu).

Figure 6:
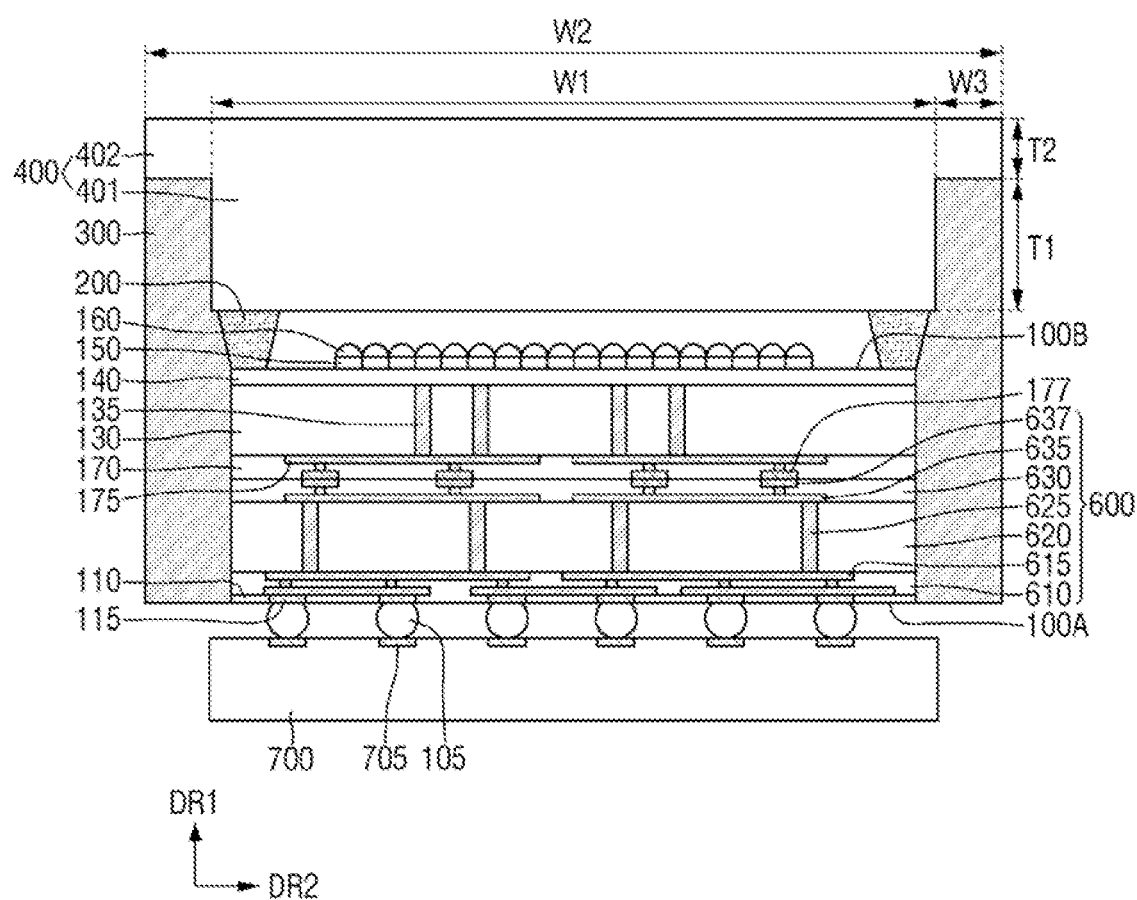
FIG. 6 is a diagram illustrating a semiconductor package according to another embodiment.

FIG. 6 is a diagram illustrating a semiconductor package according to another embodiment. For convenience of explanation, description different from contents explained using FIG. 5 will be mainly explained.

Referring to FIG. 6, the semiconductor package according to some other embodiment may further include a second semiconductor chip 700.

The second semiconductor chip 700 may be disposed on the first surface 100A of the image sensor chip 100. The connection terminal 105 may be disposed on the chip pad 705 of the second semiconductor chip 700. The second semiconductor chip 700 may be electrically connected to the image sensor chip 100 through the connection terminal 105.

The second semiconductor chip 700 may be implemented as a volatile memory such as a DRAM (dynamic RAM). However, the second semiconductor chip 700 is not limited thereto, and may also be implemented as a RAM (random access memory), a SRAM (static RAM), a SDRAM (synchronous DRAM), a T-RAM (thyristor RAM), a Z-RAM (zero capacitor RAM) or a TTRAM (Twin Transistor RAM).

FIGS. 7 to 12 are intermediate stage diagrams illustrating a method for fabricating a semiconductor package according to some embodiments.

Figure 7:
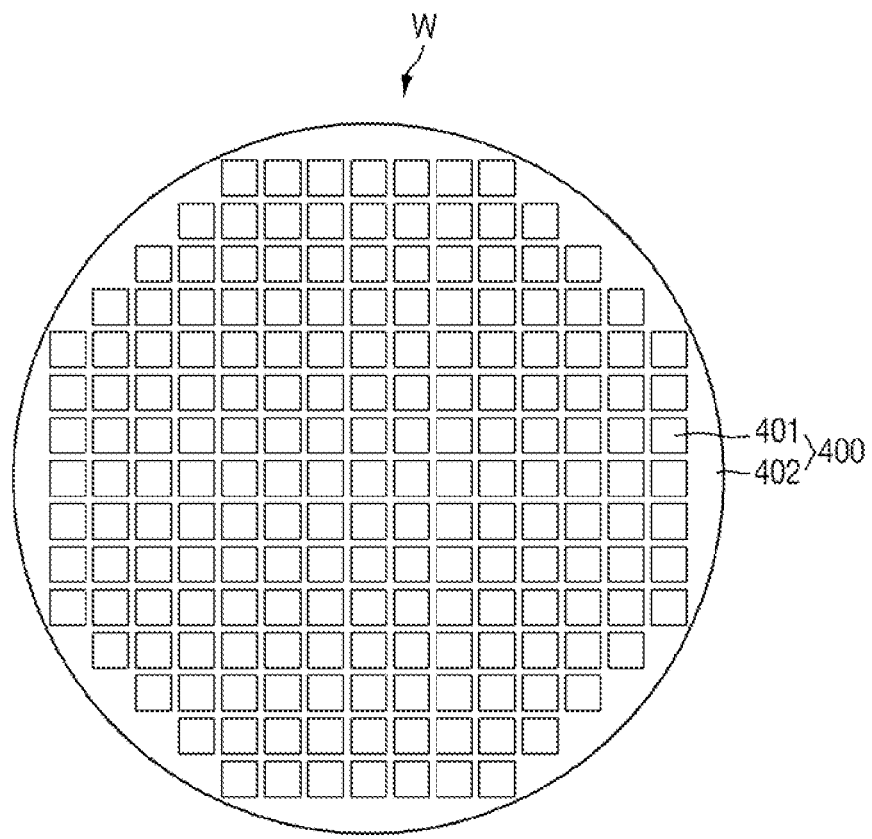
FIGS. 7 to 12 are intermediate stage diagrams illustrating a method for fabricating the semiconductor package according to an embodiment.
Figure 8:
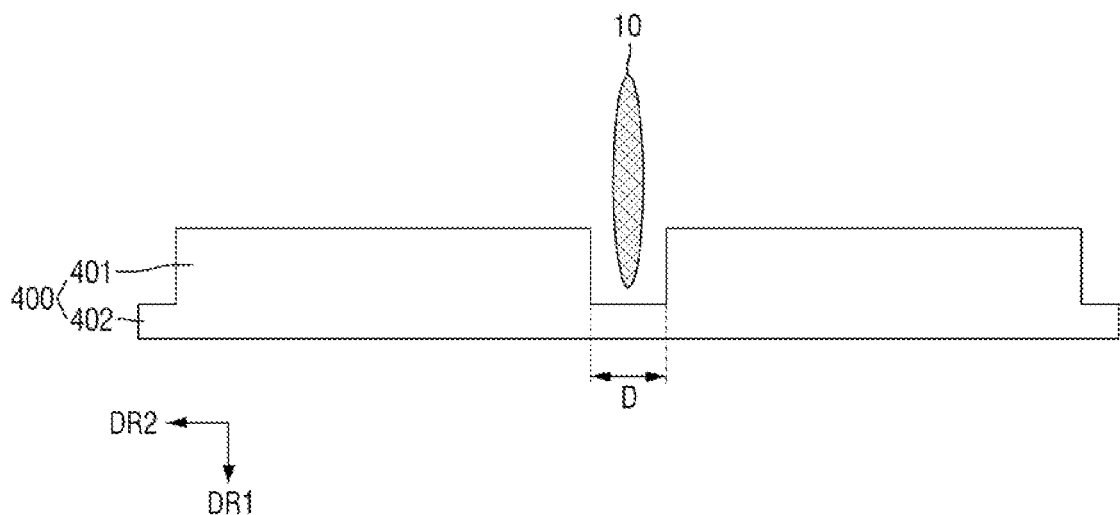

Referring to FIGS. 7 and 8, a wafer W may be prepared. The wafer W may be partially cut along a boundary of a unit wafer. The wafer W may be partially cut, for example, by a blade 10.

In some embodiments, a width D of the partially cut portions may be about 500 µm or less.

Accordingly, a transparent substrate 400 which includes a first part 401 having a first thickness T1 and a second part 402 having a second thickness T2 on the first part 401 may be formed. The second part 402 may be formed from the original transparent substrate 400 by removing a portion thereof with the blade 10.

For example, at least half the thickness of the wafer W may be cut. That is, the second thickness T2 may be greater than the first thickness T1, and the second thickness T2 is more than twice the first thickness T1.

Subsequently, referring to FIG. 9, the image sensor chip 100 may be attached onto the first part 401 of the transparent substrate 400. The image sensor chip 100 may be attached onto the transparent substrate 400 by the adhesive layer 200. The adhesive layer 200 is disposed, for example, at both ends of the first part 401 of the transparent substrate 400, and may attach the image sensor chip 100 onto the transparent substrate 400.

Figure 9:
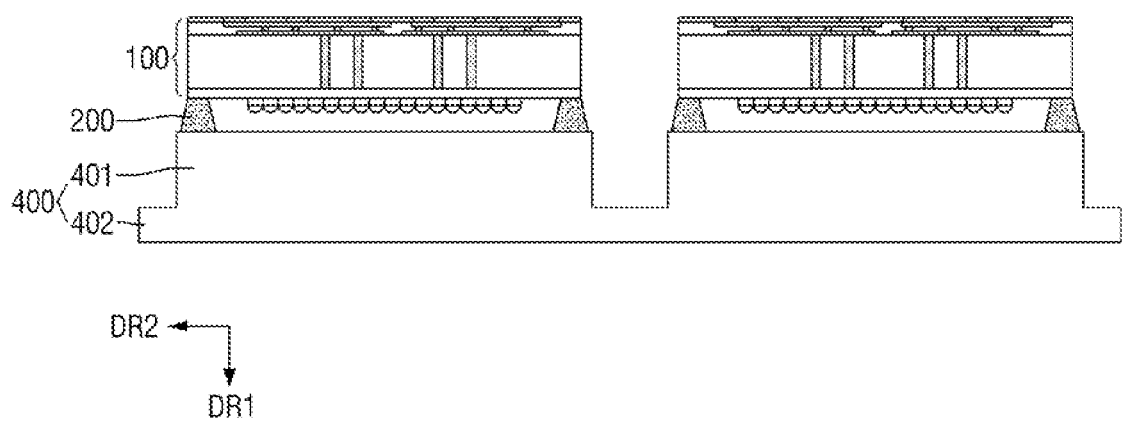

Still referring to FIG. 9, the image sensor chip 100 may be in a state in which the redistribution layer, the penetration electrode, the photoelectric conversion element, the color filter, and the microlens are all formed.

Figure 10:
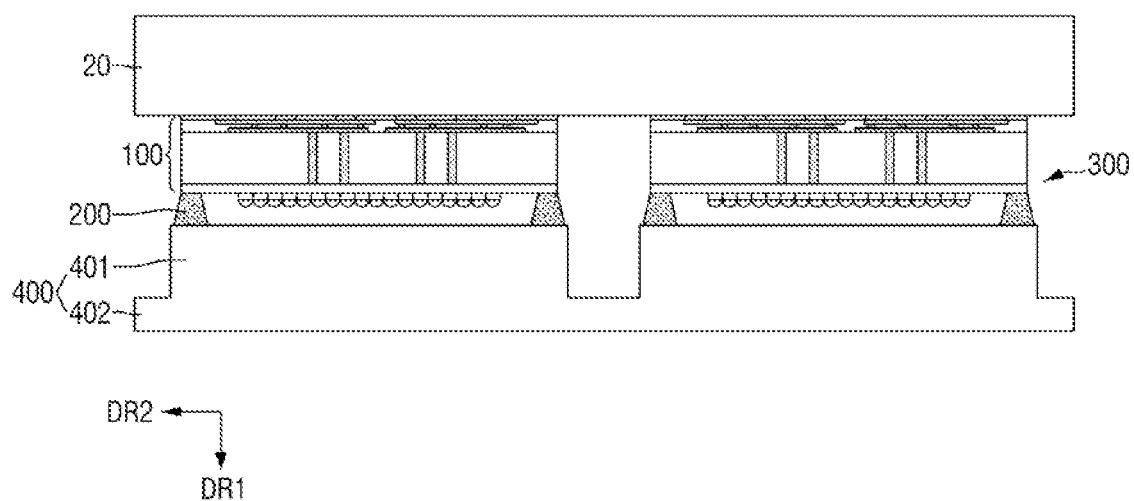

Referring to FIG. 10, the substrate 20 may be attached onto the image sensor chip 100. In some embodiments, the substrate 20 may be a tape substrate.

A space may be formed and defined by the image sensor chip 100, the first part 401 of the transparent substrate 400 and the adhesive layer 200 may be formed.

Subsequently, a mold may be injected between the transparent substrate 400 and the substrate 20. The space between the transparent substrate 400 and the substrate 20 may be filled with the mold to form a mold layer 300.

Figure 11:
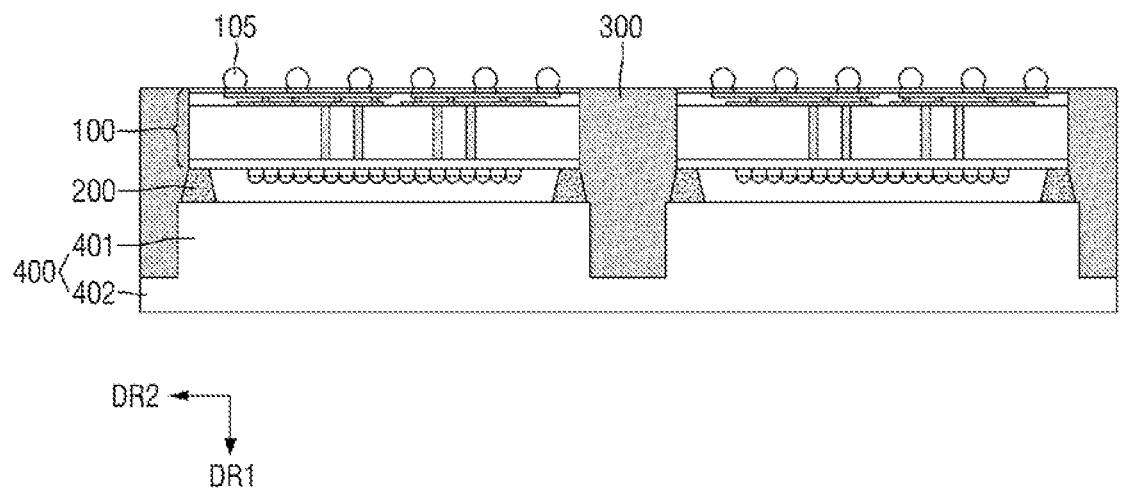

Referring to FIG. 11, the mold layer 300 may extend along side surfaces of the first part 401 on the second part 402 of the transparent substrate 400, and the side surfaces of the adhesive layer 200 and the side surfaces of the image sensor chip 100 may be formed. Further, the lower surface of the mold layer 300 in the first direction DR1 may be disposed on the same plane as the lower surface of the image sensor chip 100 in the first direction DR1. The lower surface of the mold layer 300 in the first direction DR1 may be continuous with the lower surface of the image sensor chip 100 in the first direction DR1.

Subsequently, the substrate 20 may be removed from the image sensor chip 100.

Subsequently, the connection terminal 105 may be disposed on the exposed connection pad of the image sensor chip 100. Since the connection terminal 105 is formed on the image sensor chip 100 on which the connection pad is formed, the connection terminal 105 may protrude from the image sensor chip 100.

Figure 12:
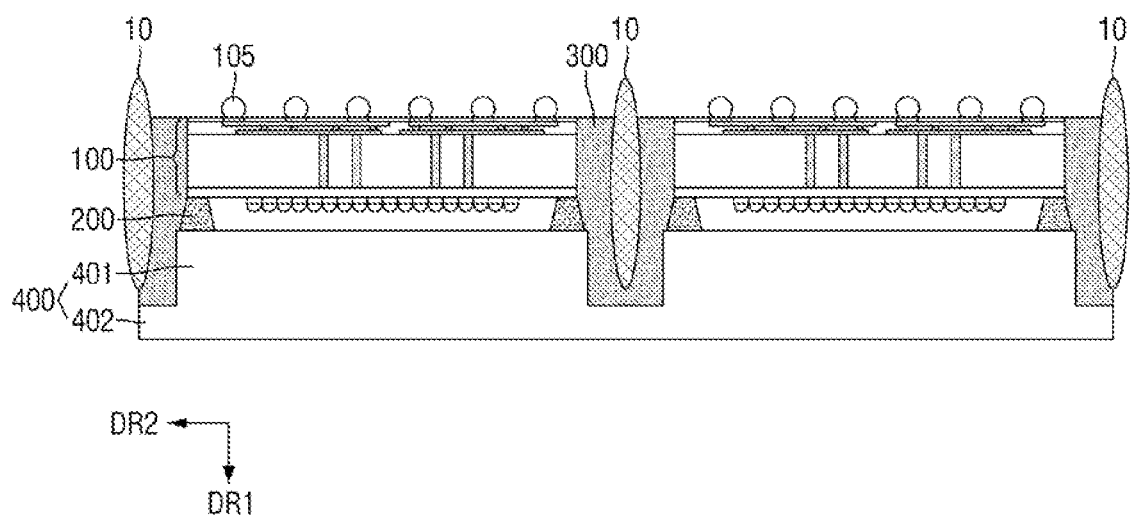

Subsequently, referring to FIG. 12, the transparent substrate 400 and the mold layer 300 may be cut. The transparent substrate 400 and the mold layer 300 may be completely cut along the boundary of the unit wafer. For example, the transparent substrate 400 and the mold layer 300 may be cut by the blade 10.

Accordingly, the semiconductor package shown in FIG. 1 may be fabricated. The side surfaces of the mold layer 300 may be disposed on the same plane as the side surfaces of the second part 402 of the transparent substrate 400. The side surfaces of the mold layer 300 may be continuous with the side surfaces of the second part 402 of the transparent substrate 400.

Figure 13:
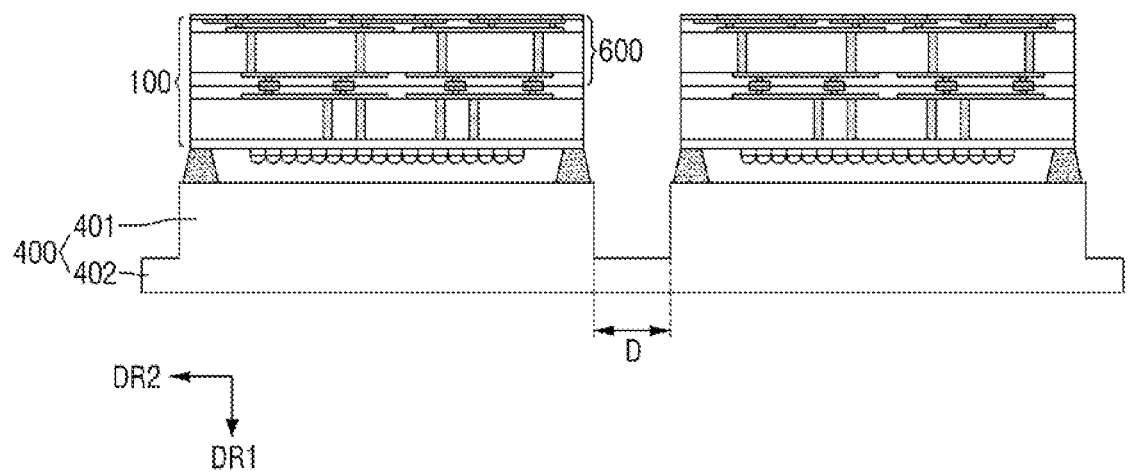
FIGS. 13 and 14 are intermediate stage diagrams illustrating a method for fabricating a semiconductor package according to another embodiment.
Figure 14:
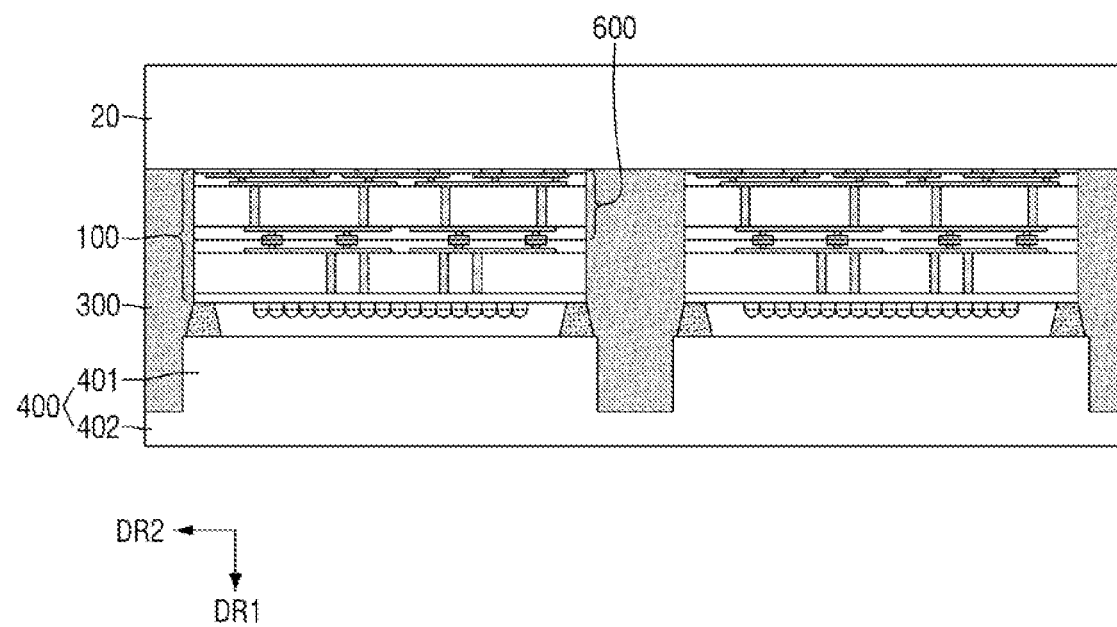

FIGS. 13 and 14 are intermediate stage diagrams illustrating a method for fabricating a semiconductor package according to another embodiment. For convenience of explanation, description different from contents explained using FIGS. 7 to 12 will be mainly explained. FIG. 13 may illustrate a state of an embodiment after the process shown in FIG. 8 is performed.

Referring to FIG. 13, the image sensor chip 100 including the first semiconductor chip 600 may be attached onto the transparent substrate 400 after the process shown in FIG. 8 is performed. The first semiconductor chip 600 may be bonded to the image sensor chip 100 by a bonding pad. The image sensor chip 100 may be attached onto the transparent substrate 400 by the adhesive layer 200.

Subsequently, referring to FIG. 14, the substrate 20 may be attached onto the image sensor chip 100. In some embodiments, the substrate 20 may be a tape substrate.

Subsequently, a mold may be injected between the transparent substrate 400 and the substrate 20 to form the mold layer 300. The mold layer 300 extends along the side surfaces of the first part 401 on the second part 402 of the transparent substrate 400, the side surfaces of the adhesive layer 200 and the side surfaces of the image sensor chip 100, but might not extend along the lower surface of the image sensor chip 100 in the first direction DR1.

Subsequently, referring to FIG. 5, the substrate 20 may be removed from the image sensor chip 100.

Subsequently, the connection terminal 105 may be attached onto the first surface 100A of the image sensor chip 100. The semiconductor package shown in FIG. 5 may be fabricated accordingly.

Although embodiments of the present disclosure have been described with reference to the attached drawings, the present disclosure is not limited to the above examples but may be produced in various forms. Those skilled in the art will appreciate that the present disclosure may be implemented in other specific forms without changing the technical ideas and essential features of the present disclosure. Therefore, it should be understood that the examples described above are illustrative and for example purposes, and are not restrictive.

What is claimed is:

1. A semiconductor package comprising:
an image sensor chip including a first surface and a second surface opposite to each other in a first direction;
a transparent substrate which is spaced apart from the second surface of the image sensor chip in the first direction, wherein the transparent substrate includes a first part having a first width in a second direction perpendicular to the first direction, and a second part on the first part, having a second width greater than the first width in the second direction;
an adhesive layer disposed between the second surface of the image sensor chip and the first part of the transparent substrate; and
a mold layer comprising a first side surface that extends along the first part of the transparent substrate and ends at a bottom surface of the second part of the transparent substrate, and a second side surface that extends along a side surface of the adhesive layer and a side surface of the image sensor chip.

2. The semiconductor package of claim 1, wherein a lower surface of the mold layer is disposed on a same plane as the first surface of the image sensor chip.

3. The semiconductor package of claim 1, wherein side surfaces of the mold layer are disposed on a same plane as side surfaces of the second part of the transparent substrate.

4. The semiconductor package of claim 1, further comprising:
a cavity defined by the second surface of the image sensor chip, the first part of the transparent substrate, and the adhesive layer.

5. The semiconductor package of claim 1, wherein a thickness of the first part in the second direction is different from a thickness of the second part in the second direction.

6. The semiconductor package of claim 5, wherein the thickness of the first part in the first direction is greater than a thickness of the second part in the first direction.

7. The semiconductor package of claim 1, wherein a difference between the second width of the second part of the transparent substrate and the first width of the first part of the transparent substrate is 500 μm or less.

8. The semiconductor package of claim 1, wherein the width of the image sensor chip in the second direction is smaller than the width of the first part of the transparent substrate in the second direction.

9. The semiconductor package of claim 1, wherein the image sensor chip includes a connection pad exposed from the first surface of the image sensor chip, a passivation layer which wraps the side surfaces of the connection pad and constitutes the first surface of the image sensor chip, a redistribution layer disposed on the passivation layer, a first substrate layer disposed on the redistribution layer and including a penetration electrode, and a second substrate layer disposed on the first substrate layer to form the second surface of the image sensor chip and wherein the image sensor chip further includes a photoelectric conversion element, and
wherein the penetration electrode penetrates the first substrate layer and electrically connects the redistribution layer and the photoelectric conversion element to each other.

10. The semiconductor package of claim 9, further comprising:
a connection terminal disposed on the connection pad and electrically connected to the connection pad.

11. The semiconductor package of claim 10, wherein the connection terminal is disposed outside of the passivation layer.

12. A semiconductor package comprising:
an image sensor chip including a redistribution layer, a first substrate layer disposed on the redistribution layer, a penetration electrode disposed in and extending in a first direction through the first substrate layer, and a second substrate layer disposed on the first substrate layer and including a photoelectric conversion element electrically connected to the redistribution layer by the penetration electrode penetrating the first substrate layer;
a transparent substrate proximate to the image sensor chip, wherein the transparent substrate includes a first part having a first width in a second direction perpendicular to the first direction, and a second part having a second width greater than the first width in the second direction and disposed on the first part;

adhesive layers disposed between the image sensor chip and the transparent substrate to space apart the image sensor chip from the transparent substrate in the second direction; and a mold layer on the second part of the transparent substrate, covering side surfaces of the first part of the transparent substrate, side surfaces of the adhesive layer and side surfaces of the image sensor chip, wherein the side surfaces of the image sensor chip have a straight shape, the penetration electrode connects the redistribution layer to the photoelectric conversion element, and includes side surfaces surrounded by the first substrate layer, and a thickness of the first part of the transparent substrate in the first direction is greater than a thickness of the second part on the first part of the transparent substrate in the first direction.

13. The semiconductor package of claim 12, wherein mold layer at least partially surrounds the redistribution layer in a second direction.

14. The semiconductor package of claim 12, wherein a lower surface of the mold layer is disposed on a same plane as the first surface of the image sensor chip.

15. The semiconductor package of claim 12, wherein the side surfaces of the mold layer are disposed on a same plane as the side surfaces of the second part of the transparent substrate.

16. The semiconductor package of claim 12, wherein the image sensor chip further includes a passivation layer disposed on the redistribution layer and spaced apart from the first substrate layer in the first direction, and a connection pad electrically connected to the redistribution layer and having a lower surface exposed by the passivation layer, and wherein the semiconductor package further comprises a connection terminal disposed on the connection pad and electrically connected to the connection pad.

17. A semiconductor package comprising:

an image sensor chip including a first surface on which a connection pad is formed, and a second surface opposite to the first surface in a first direction and on which a photoelectric conversion element is formed;

a transparent substrate disposed adjacent to and spaced apart from the second surface of the image sensor chip in the first direction, wherein the transparent substrate includes a first part having a first width in a second direction perpendicular to the first direction, and a second part disposed on the first part having a second width greater than the first width in the second direction;

adhesive layers disposed between the second surface of the image sensor chip and the first part of the transparent substrate to space apart the second surface of the image sensor chip and the first part of the transparent substrate in the second direction, wherein the adhesive layers adhere the image sensor chip and the transparent substrate to each other;

a mold layer disposed on the second part of the transparent substrate and comprising a first side surface that extends along g side surface of the first part of the transparent substrate and ends at a bottom surface of the second part of the transparent substrate, and a second side surface that extends along a side surface of the adhesive layer and a side surface of the image sensor chip; and a connection terminal disposed on the connection pad, wherein the image sensor chip includes a passivation layer which wraps the side surfaces of the connection pad and constitutes the first surface of the image sensor chip, a redistribution layer electrically connected to the connection pad on the passivation layer, a first substrate layer disposed on the redistribution layer and including a penetration electrode, and a second substrate layer including the photoelectric conversion element, the penetration electrode penetrates the first substrate layer and electrically connects the redistribution layer and the photoelectric conversion element, and a thickness of the first part of the transparent substrate in the first direction is greater than a thickness of the second part on the first part of the transparent substrate in the first direction.

18. The semiconductor package of claim 17, wherein a distance from one side wall of the first part of the transparent substrate to one side wall of the second part of the transparent substrate is 250 μm or less.

19. The semiconductor package of claim 17, further comprising:

a semiconductor chip electrically connected to the image sensor chip through the connection terminal.

20. The semiconductor package of claim 17, wherein the image sensor chip further includes a logic semiconductor chip disposed between the redistribution layer and the first substrate layer.

* * * * *